United States Patent
Fan et al.

(10) Patent No.: US 9,490,631 B2
(45) Date of Patent: Nov. 8, 2016

(54) OVER-LIMIT ELECTRICAL CONDITION PROTECTION CIRCUITS AND METHODS

(71) Applicant: Micron Technology, Inc., Boise, ID (US)

(72) Inventors: Xiaofeng Fan, Boise, ID (US); Michael Chaine, Boise, ID (US); John David Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/275,211

(22) Filed: May 12, 2014

(65) Prior Publication Data

US 2014/0240883 A1 Aug. 28, 2014

Related U.S. Application Data

(63) Continuation of application No. 13/221,777, filed on Aug. 30, 2011, now Pat. No. 8,724,268.

(51) Int. Cl.
*H02H 3/22* (2006.01)
*H02H 9/04* (2006.01)
*H01L 27/02* (2006.01)
*H05K 1/02* (2006.01)

(52) U.S. Cl.
CPC ............ *H02H 9/044* (2013.01); *H02H 9/046* (2013.01); *H01L 27/0248* (2013.01); *H01L 27/0251* (2013.01); *H05K 1/0259* (2013.01)

(58) Field of Classification Search
USPC .................................................. 361/56, 111
See application file for complete search history.

(56) References Cited

U.S. PATENT DOCUMENTS

| 5,452,171 | A | 9/1995 | Metz et al. |
| 5,465,189 | A | 11/1995 | Polgreen et al. |
| 5,637,887 | A | 6/1997 | Consiglio |
| 5,691,213 | A | 11/1997 | Chang et al. |
| 5,793,066 | A | 8/1998 | Ajit |

(Continued)

FOREIGN PATENT DOCUMENTS

| CN | 1667827 | 9/2005 |
| CN | 101283452 | 10/2008 |

(Continued)

OTHER PUBLICATIONS

Chaine, et al., "A Novel Low Voltage Base-Modulated SCR ESD Device with Low Latch-up Risk", in Proc. EOS/ESD Symposium, 2009, 109-118.

(Continued)

*Primary Examiner* — Danny Nguyen
(74) *Attorney, Agent, or Firm* — Dorsey & Whitney LLP (57) ABSTRACT

Apparatuses and methods for protecting a circuit from an over-limit electrical condition are disclosed. One example apparatus includes a protection circuit coupled to a circuit to be protected. The circuit to be protected is coupled to a pad node. The protection circuit is configured to conduct current from the pad node to a reference voltage node to protect the circuit from an over-limit electrical condition. The protection circuit has a trigger circuit coupled to the pad node and configured to trigger a shunt circuit to conduct current from the pad node to the reference voltage node responsive to a voltage provided to the pad node having a voltage exceeding a trigger voltage. In some embodiments, the trigger circuit is matched to the circuit being protected.

20 Claims, 10 Drawing Sheets

(56) References Cited

U.S. PATENT DOCUMENTS

| | | | |
|---|---|---|---|
| 5,895,940 A | 4/1999 | Kim | |
| 5,959,821 A | 9/1999 | Voogel | |
| 5,982,600 A | 11/1999 | Cheng | |
| 6,031,405 A | 2/2000 | Yu | |
| 6,130,811 A | 10/2000 | Gans et al. | |
| 6,218,881 B1 | 4/2001 | Hiraga | |
| 6,233,130 B1* | 5/2001 | Lin | 361/118 |
| 6,441,437 B1 | 8/2002 | Gossner | |
| 6,492,208 B1 | 12/2002 | Cheng et al. | |
| 6,501,137 B1 | 12/2002 | Yu et al. | |
| 6,680,833 B2 | 1/2004 | Morishita | |
| 6,690,557 B2 | 2/2004 | Hung et al. | |
| 6,696,708 B2 | 2/2004 | Hou et al. | |
| 6,850,397 B2 | 2/2005 | Russ et al. | |
| 6,909,149 B2 | 6/2005 | Russ et al. | |
| 7,106,563 B2 | 9/2006 | Lai et al. | |
| 7,336,459 B2 | 2/2008 | Chen | |
| 7,359,169 B2 | 4/2008 | Esmark et al. | |
| 7,511,345 B2 | 3/2009 | Van Camp et al. | |
| 7,659,765 B2 | 2/2010 | Ito | |
| 7,728,349 B2 | 6/2010 | Boselli | |
| 7,746,607 B2 | 6/2010 | Gauthier et al. | |
| 7,825,473 B2 | 11/2010 | Ker et al. | |
| 7,869,175 B2 | 1/2011 | Song | |
| 7,910,950 B1 | 3/2011 | Vashchenko et al. | |
| 7,911,749 B2 | 3/2011 | Lai | |
| 8,611,058 B2 | 12/2013 | Fan et al. | |
| 9,209,620 B2 | 12/2015 | Fan et al. | |
| 2002/0109950 A1 | 8/2002 | Marr | |
| 2002/0153571 A1* | 10/2002 | Mergens et al. | 257/358 |
| 2003/0011949 A1* | 1/2003 | Ker et al. | 361/56 |
| 2003/0102485 A1 | 6/2003 | Chen et al. | |
| 2003/0107406 A1 | 6/2003 | Li et al. | |
| 2003/0146474 A1 | 8/2003 | Ker et al. | |
| 2003/0179523 A1 | 9/2003 | Kodama | |
| 2004/0100745 A1 | 5/2004 | Chen et al. | |
| 2004/0120086 A1 | 6/2004 | Vassilev | |
| 2006/0043487 A1 | 3/2006 | Pauletti et al. | |
| 2006/0091464 A1 | 5/2006 | Hiraoka | |
| 2006/0244071 A1 | 11/2006 | Kondo | |
| 2007/0058307 A1 | 3/2007 | Mergens et al. | |
| 2007/0228412 A1 | 10/2007 | Yang et al. | |
| 2008/0002321 A1 | 1/2008 | Sorgeloos et al. | |
| 2008/0055804 A1 | 3/2008 | Van Camp | |
| 2008/0180869 A1 | 7/2008 | Sugahara | |
| 2008/0285199 A1 | 11/2008 | Deutschmann et al. | |
| 2009/0015974 A1 | 1/2009 | Wang et al. | |
| 2009/0021872 A1 | 1/2009 | Ker et al. | |
| 2009/0273867 A1 | 11/2009 | Whitfield et al. | |
| 2010/0027173 A1 | 2/2010 | Wijmeersch | |
| 2010/0109043 A1 | 5/2010 | Wang et al. | |
| 2010/0172059 A1 | 7/2010 | Chaine et al. | |
| 2011/0110004 A1 | 5/2011 | Maier | |
| 2012/0170160 A1 | 7/2012 | Wang et al. | |
| 2013/0050886 A1 | 2/2013 | Fan | |
| 2013/0050887 A1 | 2/2013 | Fan | |
| 2013/0141823 A1 | 6/2013 | Di Sarro | |

FOREIGN PATENT DOCUMENTS

| | | |
|---|---|---|
| KR | 2001-0024361 | 3/2001 |
| KR | 2010-0003569 | 1/2010 |

OTHER PUBLICATIONS

Bruck, et al., "Efficient Algorithms for All-to-All Communications in Multiport Message-Passing Systems", IEEE Transactions on Parallel and Distributed Systems, vol. 8, No. 11, Nov. 1997, pp. 1143-1156.

Diks and Pelc, , "Broadcasting with Universal Lists", Proceedings of the 28th Hawaii International Conference on System Sciences (HICSS 1995); IEEE 1995, pp. 564-573.

Keppens, et al., "ESD Protection Solutions for High Voltage Technologies", EOS/ESD Symposium 04, pp. 289-298.

Mergens, et al., "Biode-Triggered SCR (DTSCR) for RF-ESD Protection of BICMOS SiGe HBTs and CMOS Ultra-Thin Gate Oxides", IEEE 2003, pp. 515-518.

Sarro, et al., "Study of Design Factors Affecting Turn-On Time of Silicon Controlled Rectifiers (SCRs) in 90 and 65NM Bulk CMOS Technologies", 44th Annual International Reliability Physics Sumposium, San Jose, 2006, IEEE, pp. 163-168.

* cited by examiner

OVER-LIMIT ELECTRICAL CONDITION PROTECTION CIRCUITS AND METHODS

CROSS REFERENCE TO RELATED APPLICATION(S)

This application is a continuation of U.S. patent application Ser. No. 13/221,777, filed Aug. 30, 2011, and issued as U.S. Pat. No. 8,724,268 on May 13, 2014. The aforementioned application and patent are incorporated herein by reference, in their entirety, for any purpose.

TECHNICAL FIELD

Embodiments of the invention relate generally to integrated circuits, and more particularly, in one or more of the illustrated embodiments, to protection circuitry for over-limit electrical conditions that may damage the integrated circuits.

BACKGROUND OF THE INVENTION

Integrated circuits are connectable to "the outside world" through input nodes, output nodes, or input/output nodes such as bond pads, input pads, input/output pins, die terminals, the pads, or contact pads. Circuitry is often interposed between such nodes and active circuitry of the integrated circuit. The circuitry typically includes transistors which should be protected from over-limit electrical conditions. This may be especially true for circuits that include field-effect transistors (FETs), which are formed having a gate insulator. An uncontrolled over-limit electrical event may subject the gate insulator to a relatively high voltage that exceeds a breakdown voltage that causes permanent damage to the transistor.

An electrostatic discharge event during which the circuitry is subjected to an electrostatic discharge (ESD) is an example of an over-limit electrical condition that may cause damage to the circuitry of the integrated circuit unless adequately protected. Another example of an over-limit electrical condition for example, latch-up, may result from an "overdrive condition," An overdrive condition exists when voltages or currents at an electrical node exceed specified levels, such as a manufacturer's specification of the "normal" operating parameters for the device. Overdrive conditions can be contrasted with what is typically referred to as a normal operating conditions, that is, conditions specified by a semiconductor device manufacturer to be within specified limits. Circuitry subjected to an overdrive condition may conduct current inadvertently and without control over the current path or the magnitude of current conducted. It is desirable, however, that circuitry is designed to withstand an occasional or even sustained overdrive condition without adverse consequences. Uncontrolled overdrive conditions, in contrast, may cause over-limit electrical conditions that may damage circuitry, and consequently, should be avoided.

Typically, an over-limit protection circuit is connected to a node, such as a bond pad, that may be subjected to an over-limit electrical condition in order to protect circuitry also coupled to the node. Typical over-limit electrical condition protection circuits include circuitry that provide a low-impedance conductive path from the node to a reference voltage, such as ground, to dissipate the over-limit electrical condition before operational circuitry also coupled to the node are damaged. For example, the over-limit protection circuit keeps the potential of the bond pad from exceeding a maximum value.

Many of the protection circuits include circuits that exhibit a "snap-back" characteristic. Generally, a snap-back characteristic provides a trigger condition which when exceeded, causes the circuit to enter a low-impedance state. The low-impedance state is maintained while the electrical condition on a node exceeds a hold condition. In designing, an adequate protection circuit using a snapback circuit, the trigger condition for the snapback circuit must be appropriate for the electrical conditions the node will experience under normal operating conditions. For example, the trigger conditions should be sufficiently high to prevent the protection circuit from inadvertently triggering but low enough to trigger before operational circuitry coupled to the node are subjected to damaging over-limit electrical conditions. An example of a node that will be subjected to relatively high voltages during normal operation are high-voltage (HV) pads which are used to provide circuitry relatively high-voltages during normal operation. Over-limit protection circuitry for such pads should be designed to avoid triggering when the expected operating voltage is provided to the pad but nonetheless trigger at an over-limit electrical condition below that which will damage circuitry coupled to the pad.

Examples of conventional circuits having snapback characteristics include thyristors, such as silicon controlled rectifiers (SCRs), and overdriven metal-oxide-semiconductor (MOS) transistors, and diodes. Examples of conventional circuits having a set trigger condition, and typically a set hold condition as well, include diode-triggered SCRs (DTSCRs). Once set, however, adjusting (e.g. changing, altering, etc.) the trigger condition often requires redesign of the protection circuit. That is, the protection circuits are typically "hard-wired" and are not modified after the integrated circuit is fabricated. Moreover, trigger conditions for ESD protection and protection against latch-up conditions are often different, thus, having a protection circuit having a trigger condition set to protect against one condition may be a compromise for protecting against the other over-limit electrical conditions.

DETAILED DESCRIPTION

Certain details are set forth below to provide a sufficient understanding of embodiments of the invention. However, it will be clear to one skilled, in the art that embodiments of the invention may be practiced without these particular details. Moreover, the particular embodiments of apparatuses and methods described herein are provided by way of example and should not be used to limit the scope al the invention to these particular embodiments. In other instances, well-known circuits, control signals, timing protocols, and software operations have not been shown in detail in order to avoid unnecessarily obscuring, the invention.

Figure 1:
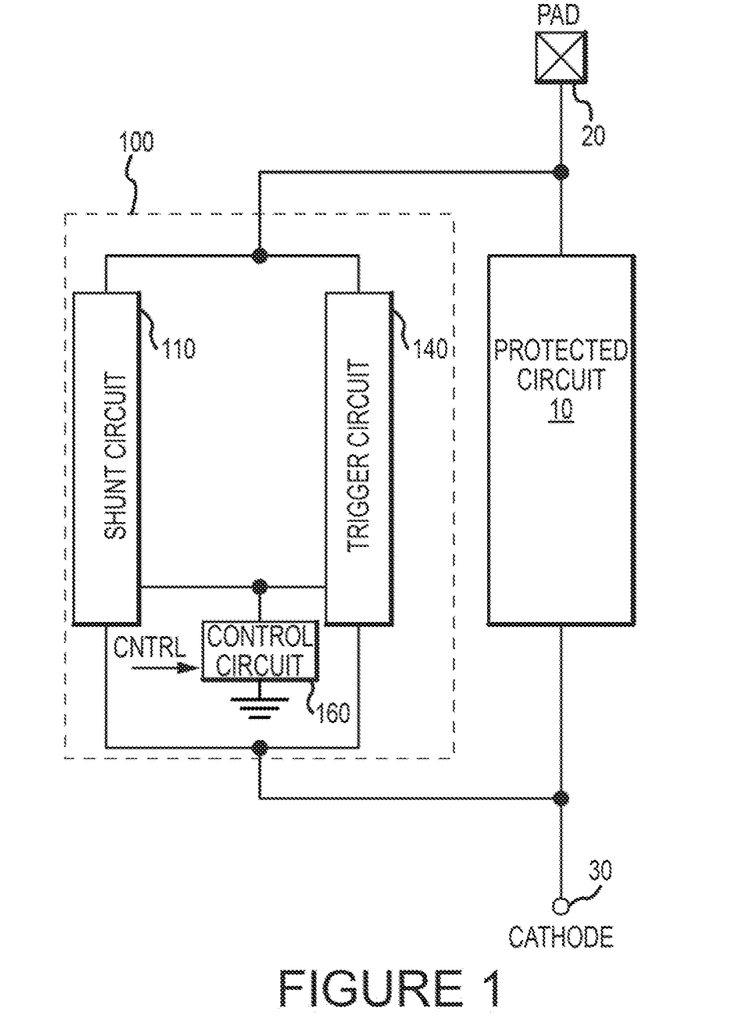
FIG. 1 is a block diagram of a protection circuit according to an embodiment of the invention.

FIG. 1 illustrates an over-voltage protection circuit 100 according to an embodiment of the invention. The protection circuit 100 is coupled to a protected circuit, for example, protected circuit 10, and protects the protected circuit 10 from being subjected to an over-voltage condition, which as previously discussed, may otherwise damage the circuitry of the protected circuit 10. As illustrated in FIG. 1, the protected circuit 10 is coupled to pad 20 and a cathode node 30. The cathode node 30 may be coupled to a reference voltage, for example, ground. An over-voltage signal may be inadvertently applied to the pad 20, in response to which the protection circuit 100 is activated and provides a current path to the reference voltage. In the embodiment of FIG. 1, the protection circuit 100 is coupled to the pad 20 and the cathode node 30.

The protection circuit 100 includes a shunt circuit 110 and a trigger circuit 140. The trigger circuit 140 is configured to trigger the shunt circuit 110 to provide a current path responsive to an over-voltage being applied to the pad 20 through which current resulting from the over-voltage may be shunted to protect the protected circuit 10 from being damaged. Additionally, the shunt circuit 110 is configured to hold a voltage across the protected circuit 10 to below a voltage the protected circuit 10 may be subjected before being damaged.

Figure 2A:
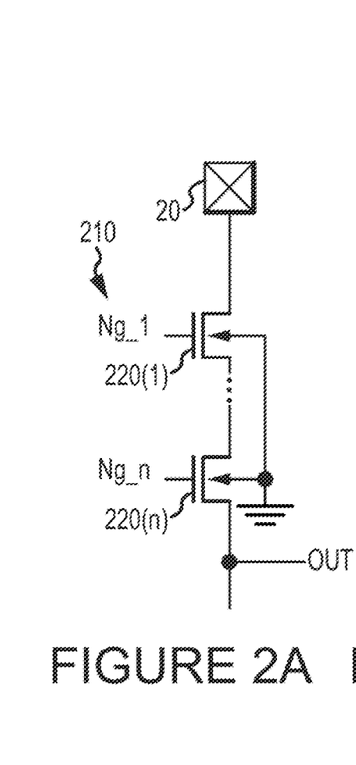
FIGS. 2A-2D are schematic diagrams of protected circuits.
Figure 2B:
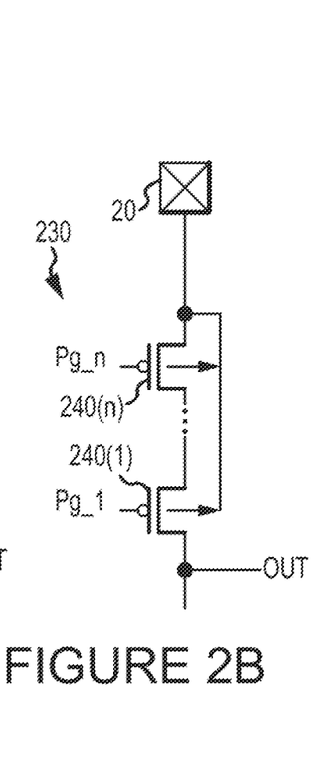

Protected circuit 10 may include one or more transistors. Examples of various protected circuits 10 are illustrated in FIGS. 2A-2D. FIG. 2A illustrates a driver 210 having one or more transistors 220(1)-220(n) that are used to provide an output signal OUT responsive to respective input signals Ng_1-Ng_n. The transistors 220(1)-220(n) are illustrated in the embodiment of FIG. 2A as n-channel field effect transistors (nFETs). FIG. 2B illustrates a driver 230 having a one or more transistors 240(1)-240(n) that are used to provide an output signal OUT responsive to respective input signals Pg_1-Pg_n. The transistors 240(1)-240(n) are illustrated in the embodiment of FIG. 2B as p-channel field effect transistors (pFETs). The OUT signal may have a relatively high-voltage provided to the pad 20.

Figure 2C:
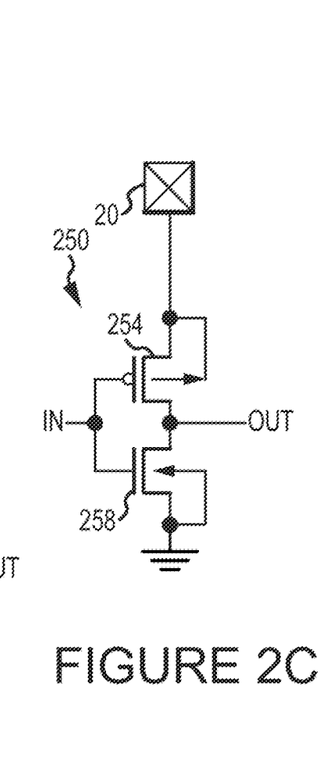
Figure 2D:
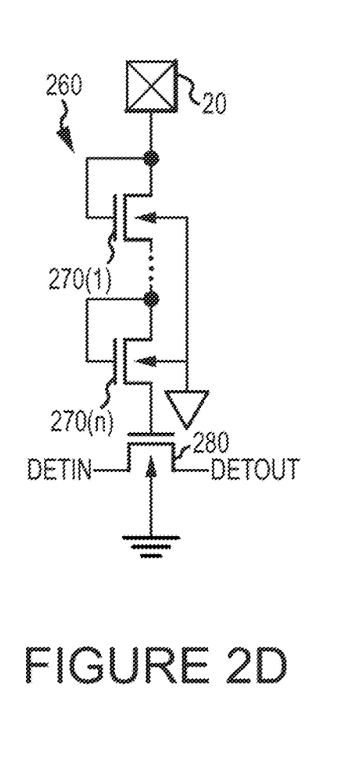

FIG. 2C illustrates a logic circuit 250 having a pull-up transistor 254 and a pull-down transistor 258. An output signal OUT is provided b the logic circuit 250 responsive to input signal IN. In the embodiment of FIG. 2C, the pull-up transistor 254 is illustrated as a pFET and the pull-down transistor 258 is illustrated as an nFET. FIG. 2D illustrates a voltage detect circuit 260 having diode-coupled transistors 270(1)-270(n) series coupled between the pad 20 and a gate of a detect transistor 280. A detection output signal DETOUT based on a detection input signal DETIN may be provided by the detect circuit 260 responsive to a voltage applied to the pad 20 exceeding a voltage. The diode-coupled transistors 270(1)-270(n) are illustrated in the embodiment of FIG. 2D as diode-coupled nFETs, and the detect transistor 280 is illustrated as a nFET. Transistors of different types than those shown in the embodiments of FIGS. 2A-2D may be used as well. The circuits of FIGS. 2A-2D have been provided by way of example and the invention is not limited to the specific examples of protected circuits 10 described.

Returning to FIG. 1, the shunt circuit 110 includes at least a portion that is formed in a p-well in which at least a portion of the trigger circuit 140 is formed, which will be described in more detail below. Leakage currents from the trigger circuit 140 resulting from an over-voltage condition are used to enhance forward biasing of a diode junction of the shunt circuit 110, and thus, trigger the shunt circuit 110. The p-well is formed in a semiconductive material, such as a semiconductor substrate. As used herein, the term semiconductive material, includes a bulk semiconductive region, an epitaxial layer, a doped well region, and the like.

In some embodiments, the trigger circuit 140 may trigger the shunt circuit 110 at a plurality of different trigger conditions. A control circuit 160 may be coupled to the shunt circuit 110 and trigger circuit 140 and a reference voltage node (e.g., ground) to adjust the trigger conditions for the protection circuit 100. The trigger conditions may be set responsive to the control signal CNTRL.

A shunt circuit 110 exhibiting is "snapback" current-voltage (I-V) characteristic may be used to provide the protection circuit 100 with the same characteristic. A protection circuit 100 having the snapback characteristic is triggered at a trigger condition to provide a current path to shunt over-voltage current. Once triggered, a voltage across the protection circuit 100 decreases to a hold condition having a voltage that is less than a voltage for the trigger condition. The lower voltage of the hold condition protects the protected circuit 10 from being damaged by an over-voltage that exceeds the maximum voltage capability of the protected circuit 10.

Figure 3:
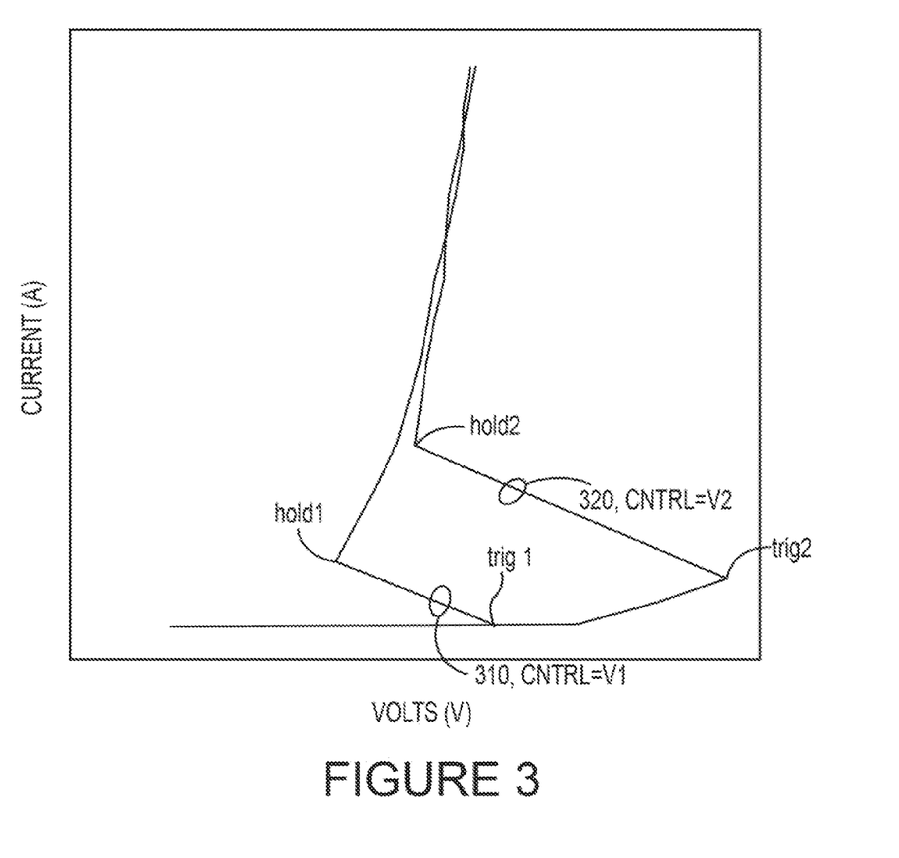
FIG. 3 is a current-voltage diagram of I-V curves exhibiting snapback characteristics according to an embodiment of the invention.

FIG. 3 illustrates snapback characteristics for two conditions of a CNTRL signal applied to the trigger circuit 140 of FIG. 1. In particular, a first I-V curve 310 represents the response of the protection circuit 100 for a CNTRL signal having a first voltage and a second I-V curve 320 represents the response of the protection circuit 100 for a CNTRL signal having, a second voltage. Each of the I-V curves exhibits a respective trigger condition, trig1 and trig2, and a hold condition hold1 and hold2. The trigger and hold conditions represent current-voltage conditions to trigger the snapback response of the protection circuit 100 and to maintain the snapback condition. Circuits having the general snapback response as illustrated in FIG. 3 that may be used for the shunt circuit 110 of the protection circuit 100 are known by those ordinarily skilled in the art. Such shunt circuits 110 may be implemented using conventional snapback circuits or snapback circuits later developed.

The I-V curves of FIG. 3 may be used to illustrate an example relationship of the protection circuit 100 where the CNTRL signal is used to control the control circuit 160 to adjust added resistance through the control circuit 160. The I-V carve associated with a CNTRL=V2 exhibits a greater trigger condition (trig2) as well as a greater hold condition (hold) relative, to the I-V curve associated with a CNTRL=V1 having trigger condition trig1 and hold condition hold1. The increase in the trigger and hold conditions from trig1/hold1 to trig2/hold2 result from decreasing the added resistance through the control circuit 160.

In some embodiments of the invention, the control circuit 160 is used during power-up of an integrated circuit in which the protection circuit is included. For example, when the integrated circuit having an embodiment of the invention is unpowered, the CNTRL signal controls the control circuit 160 to add a relative large resistance between the trigger circuit 140 and the reference voltage. As previously discussed, under this condition, the trigger voltage may be lowered for the protection circuit 100. An advantage to a lowered trigger voltage is that it will provide greater over-voltage/over-current protection to the protected circuit 10 in the event a relatively high-voltage and/or current is applied to the pad 20. That is, less voltage and/or current is necessary to trigger the protection circuit 100 to discharge the over-voltage/over-current. An example of an event that presents relatively high-voltage and/or current to a node is an ESD impulse.

Following power-up of the integrated circuit, the CNTRL signal is adjusted to control the control circuit 160 to reduce the additional resistance provided by the control circuit 160. As previously described, the decrease in resistance between the trigger circuit 140 and the reference voltage results in an increase to the trigger condition and the hold condition of the protection circuit 100. The increased hold condition increases latch-up immunity of the protection circuit 100. In some embodiments, the CNTRL signal is adjusted to increase the hold condition to approximately two-three times the operating voltage of the integrated circuit. For example, where the operating voltage for an integrated circuit is 1.0 V, the control circuit 160 is adjusted to provide a hold condition approximately 2.0-3.0 V. As previously described, the CNTRL signal can be adjusted to modulate the performance characteristics of the protection circuit 100 to provide the desired hold condition. The increased hold condition may prevent the ESD devices from triggering based cm acceptably normal power spikes that may occur during certain operation cycles. If the power spike has relatively high voltage and/or current levels that can induce damages to the integrated circuits, or if there is an ESD event, the control circuits may capture these changes, and switch mode to low trigger/hold voltage levels.

As described by the previous example, operating the protection circuit 100 through the use of the control circuit 160 in such a manner can provide both the relatively high voltage requirements to prevent latch-up and the relatively low trigger-current needed for ESD protection. In other embodiments, the control circuit 160 is not operated in a binary-type manner of providing either maximum added resistance or minimum resistance. The control circuit 160 may be additionally or alternatively adjusted continuously over the range of the available impedance using the CNTRL signal. In this manner, the added resistance, and consequently, the trigger condition for the protection circuit 100, can be adjusted to a desired level within the available range of modulation provided by the control circuit 160.

Figure 4:
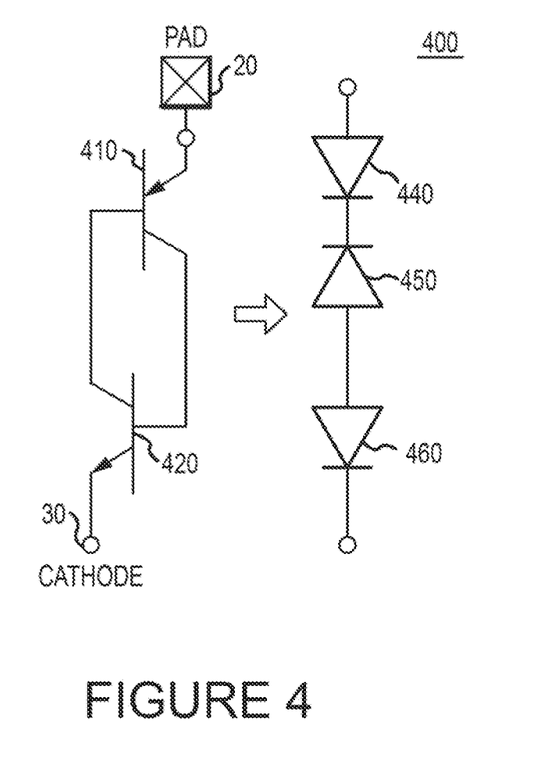
FIG. 4 is a schematic diagram of a shunt circuit according to an embodiment of the invention.

A shunt circuit 400 according to an embodiment of the invention is illustrated in FIG. 4. The shunt circuit 400 may be used as the shunt circuit 110 of the protection circuit 100 of FIG. 1. The shunt circuit 400 is a thyristor, such as a silicon controlled rectifier (SCR). As known and as illustrated in FIG. 4, an SCR is formed by a combination of PNP-NPN bipolar junction transistors (BJTs) 410, 420. The resulting circuit may be represented as three diodes 440, 450, and 460 coupled between the pad 20 and cathode node 30, as illustrated in FIG. 4. The diode 460 may be integrated with trigger circuit by being formed in a common well, as will be described in more detail below. An example conventional design includes formation of the PNP-BJTs and NPN-BJTs 410, 420 in a p+-region formed in an n-well (i.e., a well region of n-type doping) and a n+-region in p-well (i.e., a well region of p-type doping). In embodiments of the invention utilizing the shunt circuit 400 as the shunt circuit 110, a lateral NPN-BJT 420 may be formed in a p-well in which a portion of the trigger circuit is formed as well.

In operation, the shunt circuit 400 is triggered as the base-to-emitter diode of the lateral NPN-BJT 420 is forward biased. Using conventional designs, the forward bias for the base-to-emitter diode may be approximately 0.6 V at room temperature. The base-to-emitter diode may be forward biased as the voltage of the p-well in which the NPN-BJT 420 is formed increases as a result of current discharging through the inherent resistance of the p-well. Current may be provided when the voltage across the shunt circuit 400 causes a reverse-bias breakdown of the junction between the n-well in which the PNP-BJT 410 is formed and the p-well in which the NPN-BJT 420 is formed. The typical breakdown voltage for the nwell-pwell junction can be approximately 20 V. Current through the p-well may also be provided from circuits of the trigger circuit formed in the same p-well as the NPN-BJT 420, as will be described in more detail below. That is, leakage currents from the trigger circuit resulting from an over-voltage condition may be used to forward bias the base-to-emitter diode of the NPN-BJT 420 of the shunt circuit 400.

Figure 5:
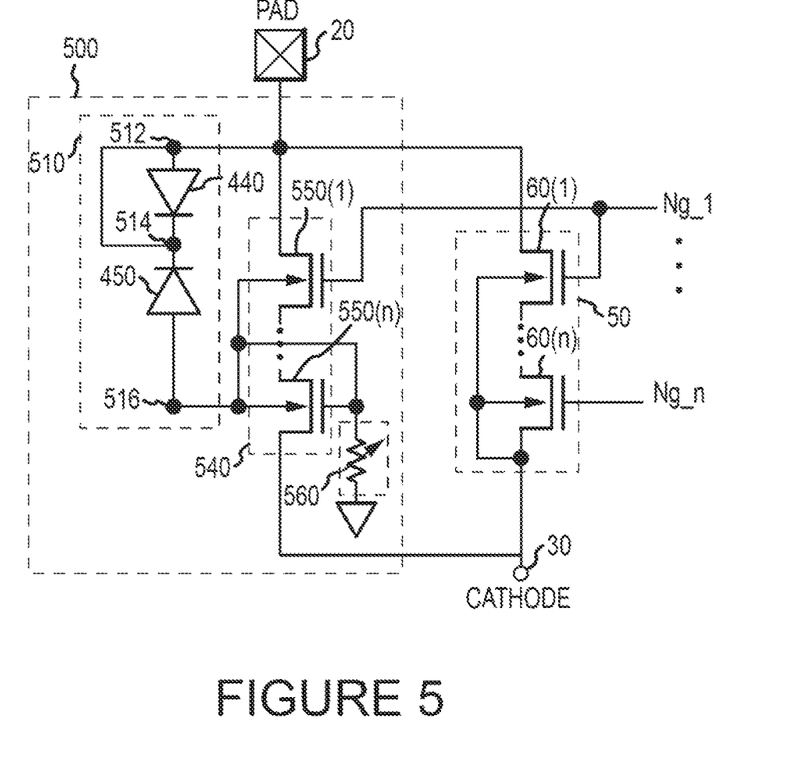
FIG. 5 is a schematic diagram of a protection circuit according to an embodiment of the invention.

FIG. 5 illustrates a protection circuit 500 according to an embodiment of the invention. The protection circuit 500 is coupled to a protected circuit 50, which is shown in the embodiment of FIG. 5 as a high-voltage driver circuit that includes one or more transistors 60(1)-60(n). The protected circuit 50 and the protection circuit 500 are coupled to a pad 20 and a cathode node 30. The protection circuit 500 includes a shunt circuit 510 and a trigger circuit 540.

In the embodiment of FIG. 5, the trigger circuit 540 is provided by a driver circuit that matches the driver circuit of the protected circuit 50. The trigger circuit 540 includes one or more transistors 550(1)-550(n) coupled in series between the pad 20 and the cathode node 30. Each of the transistors 550(1)-550(n) correspond to a respective one of the one or more transistors 60(1)-60(n) of the protected circuit 50. Transistors 550 have gates coupled to a respective one of transistors 60, except for the last transistor 550(n). Transistors 550 and 60 (other than the last transistor 550(n)) have gates coupled together and biased to minimize channel and gate-induced leakage currents. The gate of transistor 550(n) and body regions of the transistors 550(1)-550(n) are coupled to a control circuit 560. The control circuit 560 is coupled to a reference voltage for example, ground. The transistor 550(n) remains in an "off" state due to the coupling of its gate to ground through the control circuit 560. The shunt circuit 510 includes an SCR having an anode node 542 and it base node 514 coupled together, and a second base node 516 coupled to the body regions of the transistors 550(1)-550(n).

The control circuit 560 is represented by an adjustable resistance in the embodiment of FIG. 5. The control circuit 560 may be used to set different voltages at which the trigger circuit 540 triggers the shunt circuit 510. The adjustable resistance of the control circuit 560 may be used to adjust resistance between the reference voltage and the body regions of the transistors 550(1)-550(n) and base node 516. Generally, a lower resistance added by the control circuit 560 results in a higher trigger voltage than for a higher control circuit resistance. Providing the control circuit 560 allows for base modulation of the SCR of the trigger circuit 510, which can be used to adjust the trigger conditions of the protection circuit 500.

Using a trigger circuit 540 that matches the circuitry of the protected circuit 50 provides a benefit that trigger circuit 540 will typically trigger the shunt circuit 510 earlier than when the protected circuit 50 begins to react to an over-voltage applied to the pad 20, thereby preventing the protected circuit 50 from being damaged by the over-voltage. Trigger circuits matching the various protected circuits illustrated by FIGS. 2A-2D may be used in protection circuits coupled to a corresponding, protected circuit. In other embodiments of the invention, however, the trigger circuit may not match the protected circuit.

In other embodiments of the ESD protection, trigger circuit 540 and protected circuit 50 may be fully or partially merged. A portion of all of the transistors 60(1)-60(n) of the protected circuit 50 may replace the transistors 550(1)-550(n) to trigger the shunt circuit 510. When transistors 60(1)-60(n) replace the original, trigger transistors 550(1)-550(n), the control circuit may still be used to control the p-well 540.

Figure 6:
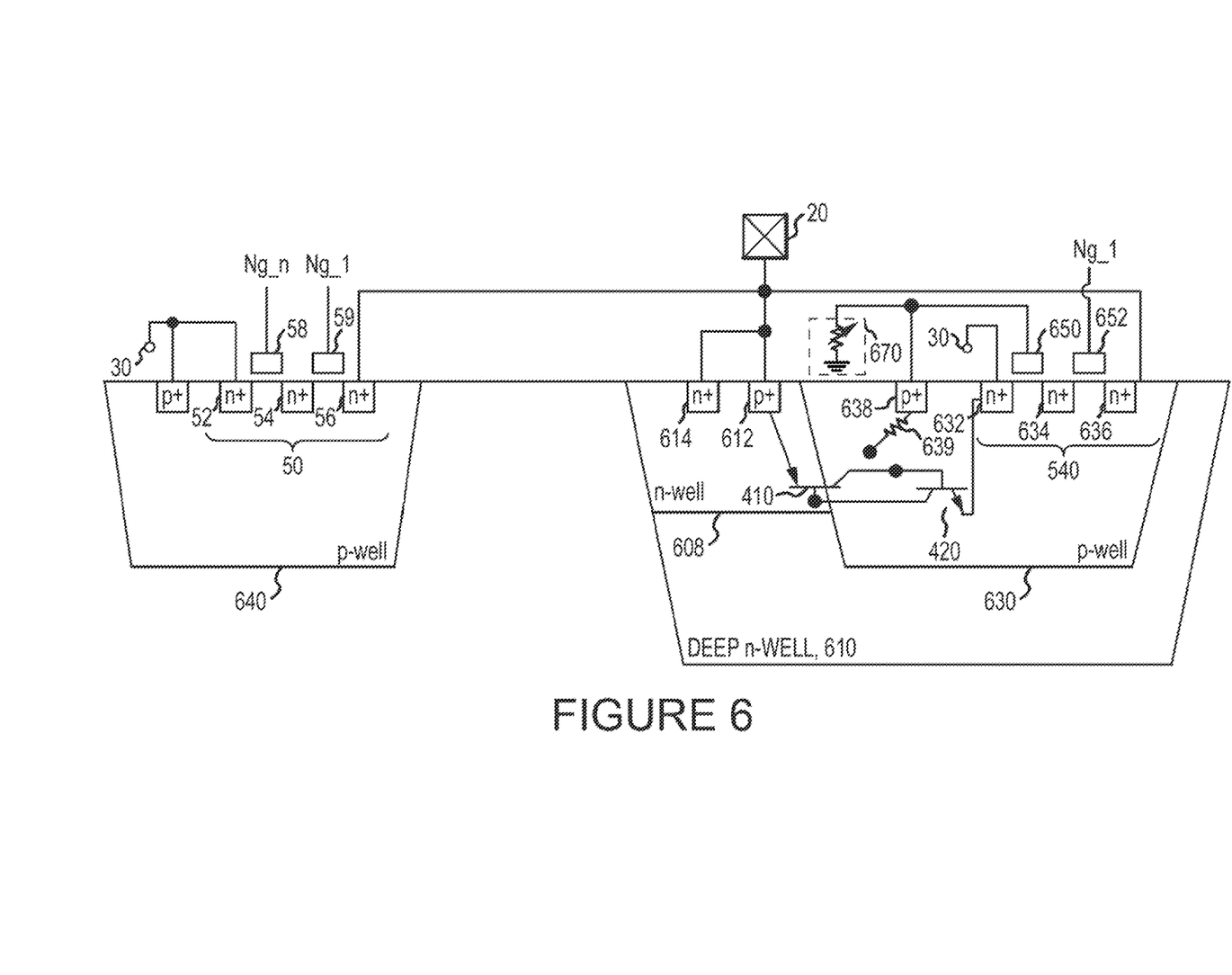
FIG. 6 is a cross-sectional diagram of the protection circuit of FIG. 5 according to an embodiment of the invention.

Portions of the shunt circuit 510 and the trigger circuit 540 may be formed in the same p-well (e.g., an isolated p-well). For example, the diode 460 (not shown in FIG. 5) may be formed in the same p-well as the transistors of the trigger circuit 540. The trigger circuit 540 may provide leakage currents under an over-voltage condition that are used to forward bias the diode 460 of the shunt circuit 510. FIG. 6 illustrates a cross-sectional drawing of the shunt circuit 510 and trigger circuit 540 according to an embodiment of the invention. The protected circuit 50 is also illustrated in FIG. 6.

A deep n-well 610 is formed in which p-well 630 and n-well 60$ are formed. Portions of the shunt circuit 510 and the trigger circuit 540 are formed in the p-well 630. The protected circuit 50 is formed in p-well 640 by n-regions 52, 54, and 56, as well as, gates 58 and 59 formed over the p-well 640. The n-region 52 is coupled to cathode node 30 and the n-region 56 is coupled to pad 20.

The SCR of the shunt circuit 510, which as previously discussed, includes back-to-back PNP-BJT and NPN-BJT PNP-BJT 410 and NPN-BJT 420 of FIG. 4). A PNP-BJT is formed by p-region 612, the n-well 608, and p-well 630. An NPN-BJT 420 is formed by n-well 608, p-well 630, and n-region 632. An n-region 614 is used to couple the p-region 612 (i.e., anode of PNP-BJT 650) to the n-base/n-collector of n-well 608. An externally accessible pad, for example, pad 20, is coupled to the p-region 612. The n-region 632 may be used to couple with the cathode of the SCR of the shunt circuit 510.

The trigger circuit 540 is formed by n-regions 632, 634 636, formed in the p-well 630, 630, and gates 650 and 652 formed over the p-well. In particular, with reference to FIG. 5, the transistor 550(1) is formed by n-regions 634, 636, and gate 652, and the transistor 550(n) is formed by n-regions 632, 634, and gate 650. The n-region 636 also provides for coupling the trigger circuit 540 to the pad 20. Body regions of the transistors 550(1)-550(n) and the p-base of the NPN-BJT 660 are represented by p-well 630. A p-region 638 provides an electrical connection to the p-base of the NPN-BJT 660 and the body of transistors 550(1)-550(n) of p-well 630. As known, a parasitic p-well resistance, represented in FIG. 6 as Rpwell 639 is present between the p-base of the NPN-BJT 420 and the p-region 638. The p-region 638 is coupled to a control circuit 670 (e.g., control circuit 560) and to gate 650 of the transistor 550(n), as shown in FIG. 5. The control circuit 670 is shown schematically in FIG. 6. Those ordinarily skilled in the art, however, have sufficient knowledge to form the control circuit 670 and to couple the control circuit 670 to p-well 630 and to gate 650.

In operation, under normal operating conditions the trigger circuit 540 remains biased in an inactive state by the coupling the gate of transistor 550(1) to the gate of transistor 60(1), as well as coupling the gate of transistor 550(n) to a reference voltage e.g., ground). When an over-voltage condition occurs, for example, an ESD event which applies relatively high voltage to the pad 20, a reverse-bias leakage conducts current from the n-region 636 (i.e., a drain of the trigger circuit 540) to the p-well 630, and from the p-well through the control circuit 670 to the reference voltage. Due to the Rpwell 639 and the resistance of the control circuit 670, the voltage of the p-well 630 increases. The increase in voltage of the p-well in effect forward biases the emitter-base of the NPN-BJT 420, which causes the SCR of the shunt circuit 510 to conduct from the pad 20 to the reference voltage. The additional current provides positive feedback to further forward bias the emitter-base. The voltage at the pad 20 is also controlled to a magnitude that is generally below the voltage at which the trigger circuit 540 triggered the SCR of the shunt circuit 510. Thus, the protected circuit 50 is protected by maintaining the voltage below the trigger voltage and shunting resulting from an ESD event through the SCR of the shunt circuit 510 rather than through the protected circuit 50.

The adjustable resistance of the control circuit 670 may be used to set different voltages at which the trigger circuit 540 triggers the shunt circuit 510. A lower resistance provided by the control circuit 670 effectively results in a higher trigger voltage than for a higher control circuit resistance, or conversely, a higher resistance provided by the control circuit 670 effectively results in a lower trigger voltage for a lower control circuit resistance. That is, the p-well current required to forward bias the base-to-emitter of the NPN-BJT 420 is decreased with a higher resistance., thereby effectively decreasing the trigger voltage of the protection circuit 500.

Figure 7:
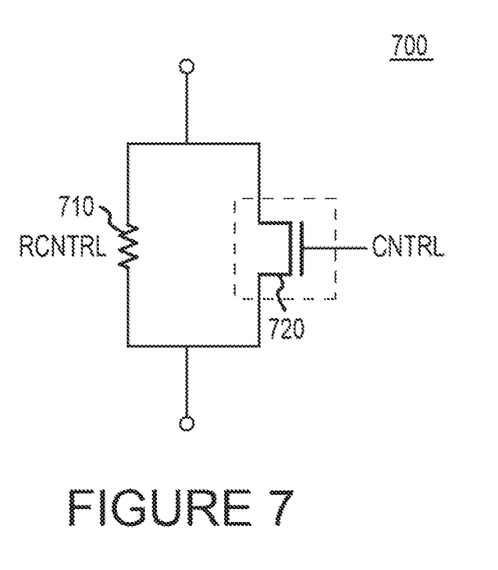
FIG. 7 is a schematic diagram of a control circuit for a protection according to an embodiment of the invention.

FIG. 7 illustrates a control circuit 700 for a protection circuit according to some embodiments of the invention. As previously described, control circuits 560 and 670 may be used to set different voltages at which a trigger circuit triggers a shunt circuit. The control circuit 700 may be used for the control circuits 560 and 670. The control circuit 700 includes a resistance 710 and a transistor 720 coupled in parallel to the resistance 710. The transistor 720 is controlled by a control signal CNTRL. The resistance 710 is illustrated in FIG. 7 as a resistor Rcontrol and the transistor 720 is illustrated as a nFET. In some embodiments of the invention, the resistance 710 and the transistor 720 may be implemented using other circuits.

In operation, the transistor 720 is used to adjust the overall resistance between a reference voltage to which a trigger circuit is coupled and a p-well region in which at least a portion of a shunt circuit and at least a portion of a trigger circuit are formed. The resistance between the p-well and the reference voltage may be adjusted based at least in part on the CNTRL signal. Generally, a lower resistance provided by the control circuit 700 effectively results in a higher trigger voltage than for a higher control circuit resistance. As a result, the resistance between the p-well and the reference voltage can be modulated to adjust the snapback performance characteristics of the protection circuit.

For example, in embodiments of the invention utilizing the protection circuit 500 (FIG. 5) and the control circuit 700, the CNTRL signal can be used to in effect modulate trigger and hold conditions for the protection circuit 500. Operation, of the protection circuit and the control circuit 700 will be made with reference to FIG. 3.

Under a first condition with CNTRL=V1 (e.g., V1<Vt of the transistor 720) the transistor 720 behaves, as an open circuit, thereby adding the Rcontrol resistance to the total resistance between the p-well and reference voltage of resistance 710. As a result, the p-well current required to forward bias the base-to-emitter of the NPN-BJT 420 is decreased, thereby effectively decreasing the trigger voltage of the protection circuit 500. In some embodiments, the resistance 710 is a relatively high resistance, for example, 50-100 kohms.

In contrast, under a second condition with CNTRL=V2 (e.g., V2>Vt), the resistance of the control circuit 700 will be less than Rcontrol of the resistance 710. With the lower resistance, the trigger voltage for the protection circuit 500 effectively increases, in a condition where the CNTRL signal is high enough to cause the transistor 720 to have a low resistance, for example, around 100 ohms, which results in essentially electrically shorting the p-well to ground, the protection circuit 500 will exhibit performance characteristics similar to having an un-modulated shunt circuit 510.

Figure 8:
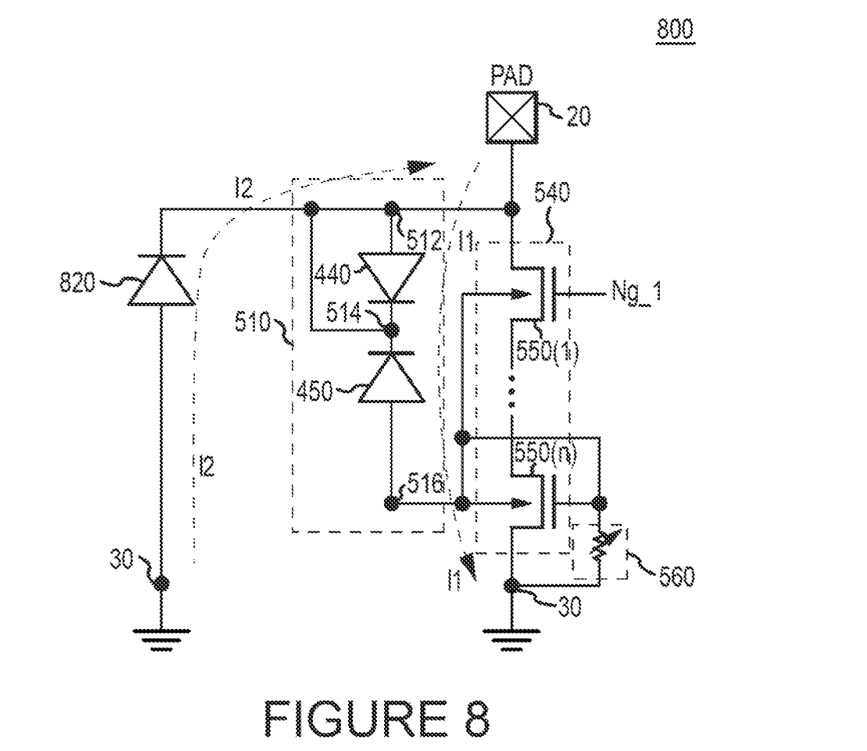
FIG. 8 is a schematic diagram of a protection circuit according to an embodiment of the invention.

FIG. 8 illustrates a protection circuit 800 according to an embodiment of the invention. The protection circuit 800 includes similar components as the protection circuit 500 previously described with reference to FIG. 5. The same reference numbers used for the embodiment of FIG. 5 are used in FIG. 8 where applicable. The protection circuit 800 further includes a diode 820 coupled between the cathode node 30 and the pad 20 in contrast to the protection circuit 500. The cathode node 30 is illustrated in FIG. 8 as being coupled to a reference voltage, for example, ground. The diode 820 may be a diode configured to provide ESD protection for ESD events that cause current to conduct from the cathode node 30 to the pad 20. As a result, the protection circuit 800 provides current conduction during over-voltage conditions from the pad 20 to the cathode node 30 (i.e., current I1) as well as from the cathode node 30 to the pad 20 (i.e., current I2). With reference to the cross-sectional view of FIG. 6, the diode 820 may be formed in n-well 608 by further forming a p-region in the n-well 608 to provide the anode of diode 820. The p-region may be coupled to the cathode node 30.

Figure 9:
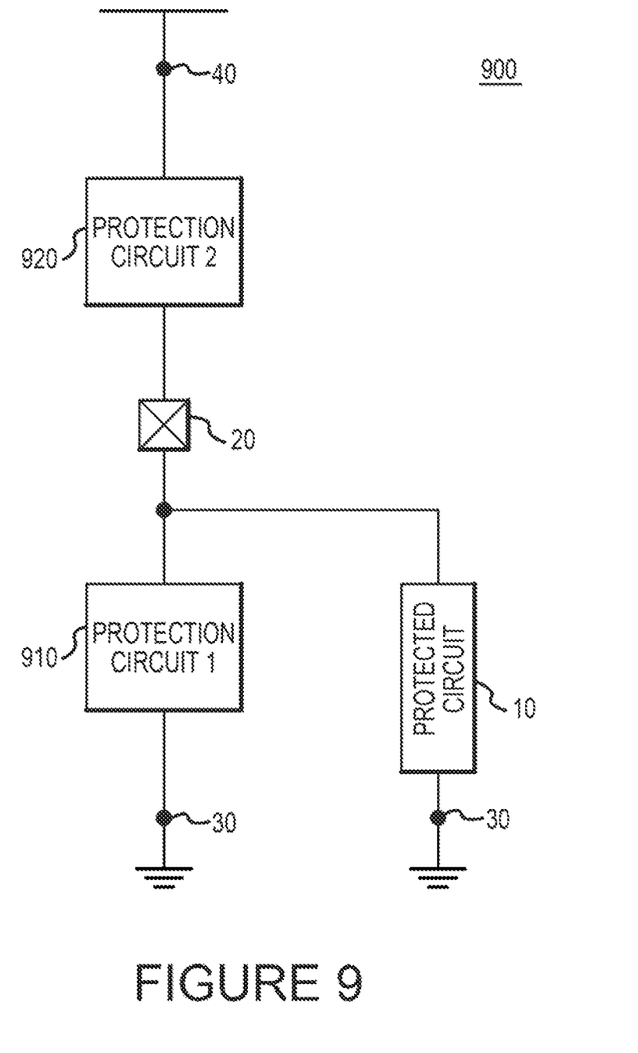
FIG. 9 is a block diagram of a protection circuit according to an embodiment of the invention.

FIG. 9 illustrates a protection circuit 900 according to an embodiment of the invention. The protection circuit 900 includes a first protection circuit 910 coupled to a pad 20 and a cathode node 30, shown in FIG. 9 as being coupled to a reference voltage node (e.g., ground). The protection circuit 900 further includes a second protection circuit 920 coupled to the pad 20 and a power supply node 40 which may be coupled to a power supply, for example, Vcc. Generally, the voltage coupled to the power supply node 40 is less than the voltage provided, to the pad 20. A protected circuit 10 is coupled to the pad 20 and the cathode node 30. The first protection circuit 910 is configured to conduct current from the pad 20 to the cathode as well as conduct current from cathode node 30 to the pad 20. The first protection circuit 910 may be implemented using the protection circuit 800 of FIG. 8, which includes a diode configured to provide ESD protection for ESD events that cause current to conduct from the cathode node 30 to the pad 20. The second protection circuit 920 is configured to conduct current from the pad 20 to the power supply node 40. The second protection circuit 920 may be implemented using the protection circuit 500 of FIG. 5. The protection circuit 900 may be used to provide ESD protection for both power and ground sides.

Figure 10:
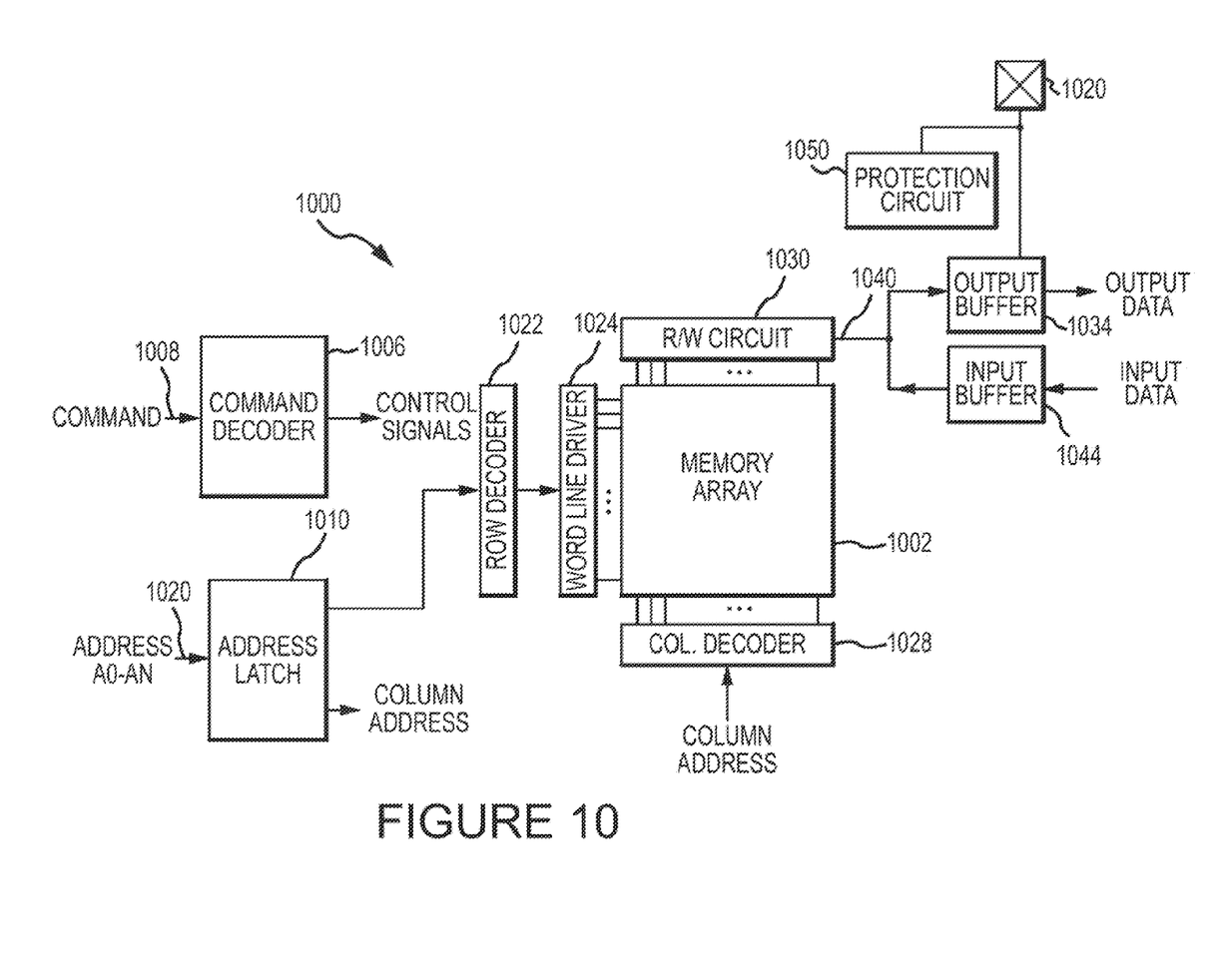
FIG. 10 is a block diagram of a memory including a protection circuit according to an embodiment of the invention.

FIG. 10 illustrates a portion of a memory 1000 according to an embodiment of the present invention. The memory 1000 includes an array 1002 of memory cells, which may be, for example, DRAM memory cells, SRAM memory cells, flash memory cells, or some other types of memory cells. The memory 1000 includes a command decoder 1006 that receives memory commands through a command bus 1008 and generates corresponding control signals within the memory 1000 to carry out various memory operations. Row and column address signals are applied to the memory 1000 through an address bus 1020 and provided to an address latch 1010. The address latch then outputs a separate column address and a separate row address.

The row and column addresses are provided by the address latch 1010 to a row address decoder 1022 and a column address decoder 1028, respectively. The column address decoder 1028 selects bit lines extending through the array 1002 corresponding to respective column addresses. The row address decoder 1022 is connected to word line driver 1024 that activates respective rows of memory cells in the array 1002 corresponding to received row addresses. The selected data line (e.g., a bit line or bit lines) corresponding to a received column address are coupled to a read/write circuitry 1030 to provide read data to a data output buffer 1034 via an input-output data bus 1040. The output buffer 1034 may include output driver circuits (not shown) coupled to pad 1020 to be provided a relatively high voltage when providing output data. Write data are applied to the memory array 1002 through a data input buffer 1044 and the memory array read/write circuitry 1030. The command decoder 1006 responds to memory commands applied to the command bus 1008 to perform various operations on the memory array 1002. In particular, the command decoder 1006 is used to generate internal control signals to read data from and write data to the memory array 1002.

Over-voltage/over-current protection circuit 1050 according to an embodiment of the present invention is coupled to the pad 1020. The protection circuit 1050 protects circuits of the output buffer 1034 that are coupled to the pad 1020 (e.g., driver circuits) in the event a relatively high-voltage/high-current signal is applied to the pad 1020. Additionally, as previously discussed, the protection circuit 1050 allows for modulating the trigger conditions and the hold conditions for the protection circuit. In some embodiments, the protection circuit may be used in power-up sequences for the memory 1000, as previously discussed. That is, while no power is applied to the memory 1000, the trigger conditions for the protection circuit 1050 is relatively low. In contrast, after power has been applied to the memory 1000, the trigger conditions for the protection circuit 1050 is modulated to a higher trigger condition, relative to when no power is applied.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:
1. An apparatus, comprising:
   a first circuit configured to protect a protected circuit from an over-voltage condition, the first circuit having a trigger circuit coupled to a first node and configured to trigger a shunt circuit to conduct current from the first node to a second node responsive to a voltage applied to the first node exceeding a trigger voltage, wherein the protected circuit comprises a first plurality of transistors and the trigger circuit comprises a second plurality of transistors, each transistor in the second plurality of transistors corresponding to a transistor in the first plurality of transistors.

2. The apparatus of claim 1, wherein the trigger circuit is further configured to trigger the shunt circuit at a plurality of trigger voltages.

3. The apparatus of claim 2, wherein the trigger circuit is configured to trigger the shunt circuit responsive to the voltage applied to the first node exceeding a first trigger voltage during power-up and further configured to trigger the shunt circuit responsive to the voltage applied to the first node exceeding a second trigger voltage during normal operation, wherein the second trigger voltage is greater than the first trigger voltage.

4. The apparatus of claim 1, wherein the shunt circuit is configured to include a threshold condition for maintaining the shunt circuit in a low-impedance state.

5. The apparatus of claim 4, wherein the shunt circuit is configured to include a plurality of threshold conditions.

6. The apparatus of claim 1, further comprising a control circuit coupled to the trigger circuit and configured to control a trigger condition of the trigger circuit.

7. The apparatus of claim 6; wherein the control circuit comprises an adjustable resistance coupled to the trigger circuit.

8. An apparatus, comprising:
a protected circuit coupled between a first and a second node; and
a protection circuit coupled to the protected circuit and configured to conduct current from the first node to the second node responsive to an over-voltage condition, the protection circuit comprising:
a shunt circuit configured to conduct the current from the first node to the second node; and
a trigger circuit; coupled to the shunt circuit, and configured to trigger the shunt circuit responsive to the over-voltage condition being greater than a trigger condition, wherein the protected circuit comprises a first plurality of transistors and the trigger circuit comprises a second plurality of transistors, each transistor in the second plurality of transistors corresponding to a transistor in the first plurality of transistors.

9. The apparatus of claim 8, further comprising a control circuit coupled to the trigger circuit and configured to adjust the trigger condition.

10. The apparatus of claim 9, wherein the control circuit is configured to adjust the trigger condition lower during power-up and to adjust the trigger condition higher during normal operation.

11. The apparatus of claim 8, wherein the shunt circuit comprises a silicon controlled rectifier.

12. The apparatus of claim 11, wherein at least a portion of the silicon controlled rectifier is formed in p-doped well of a semiconductor.

13. The apparatus of claim 12, wherein a portion of the trigger circuit is formed in the p-doped well of the semiconductor.

14. The apparatus of claim 8, wherein the trigger circuit is configured to trigger the shunt circuit at a plurality of different trigger conditions.

15. An apparatus, comprising:
a protection circuit coupled to a first node and configured to provide a current path to shunt a first over-voltage condition during power-up to a second node and further provide the current path to shunt a second over-voltage condition during normal operations to the second node, wherein the protection circuit comprises a shunt circuit and a trigger circuit, wherein the protected circuit comprises a first plurality of transistors and the trigger circuit comprises a second plurality of transistors, each transistor in the second plurality of transistors corresponding to a transistor in the first plurality of transistors.

16. The apparatus of claim 15, wherein the first over-voltage condition triggers at a first trigger voltage and the second over-voltage condition triggers at a second trigger voltage, wherein the second trigger voltage is higher than the first trigger voltage.

17. The apparatus of claim 15, wherein the trigger circuit is configured to set the first and second over-voltage conditions.

18. The apparatus of claim 15, further comprising a control circuit configured to adjust the over-voltage trigger conditions responsive to an operational state of the protection circuit.

19. The apparatus of claim 18, wherein the control circuit is configured to lower the trigger condition during power-up and wherein the control circuit is configured to raise the trigger condition during normal operations.

20. The apparatus of claim 19, wherein the control circuit is configured to continuously adjust the trigger condition over a range of trigger conditions.

* * * * *